United States Patent [19]

Anantha et al.

[11] 4,196,440

[45] Apr. 1, 1980

[54] LATERAL PNP OR NPN WITH A HIGH GAIN

[75] Inventors: Narasipur G. Anantha, Hopewell Junction; Harsaran S. Bhatia; Santosh P. Gaur, both of Wappingers Falls; Hans B. Pogge, Hopewell Junction, all of N.Y.

[73] Assignee: International Business Machines Corporation, Armonk, N.Y.

[21] Appl. No.: 909,338

[22] Filed: May 25, 1978

[51] Int. Cl.$^2$ ............................................. H01L 29/06
[52] U.S. Cl. ................................. 357/35; 357/49; 357/44; 357/55
[58] Field of Search .................... 357/35, 44, 49, 40, 357/55

[56] References Cited

U.S. PATENT DOCUMENTS

| | | | |
|---|---|---|---|
| 3,656,034 | 4/1972 | Rideout | 317/235 R |
| 3,904,450 | 9/1975 | Evans | 148/175 |
| 3,971,059 | 7/1976 | Dunkley | 357/44 |
| 4,005,453 | 1/1977 | Le Can | 357/49 |
| 4,051,506 | 9/1977 | Horie | 357/55 |
| 4,110,779 | 8/1978 | Rathbone | 357/34 |

*Primary Examiner*—Martin H. Edlow
*Attorney, Agent, or Firm*—George O. Saile

[57] ABSTRACT

Lateral PNP or NPN devices in isolated monocrystalline silicon pockets wherein silicon dioxide isolation surrounds the pocket and partially, below the surface, within the isolated monocrystalline region are described. The P emitter or N emitter diffusion is made over the portion of the silicon dioxide that partially extends into the monocrystalline isolated pocket. This structure reduces the vertical current injection which will give relatively high (beta) gain even at low base to emitter voltages.

10 Claims, 6 Drawing Figures

LATERAL PNP OR NPN WITH A HIGH GAIN

DESCRIPTION

Technical Field

This invention relates to lateral bipolar transistors and, more particularly, lateral PNP or NPN transistors.

Background Art

In the monolithic integrated circuit technology, it is usually necessary to isolate various active and passive elements from one another in the integrated circuit structure. These devices have been isolated by back biasing PN junctions, partial dielectric isolation and complete dielectric isolation. The dielectric materials used have been silicon dioxide, glass, etc. The preferred isolation for these active devices and circuits is some form of dielectric isolation. The dielectric isolation has a substantial advantage over the PN junction isolation because it allows the abutting of the circuit elements against the isolation, and thereby results in greater density of packing of the active and passive devices on the integrated circuit chip. One form of dielectric isolation involves the formation of grooves or depressions in silicon where the isolation regions are to be formed. During the groove formation, the remainder of the silicon surfaces are protected by a protective film which is substantially unaffected by the silicon etch used to form the grooves. The usual protective layer is a silicon nitride, silicon dioxide sandwich layer. Following the formation of the grooves by a conventional chemical etching or reactive ion etching, the silicon body is subjected to an oxidation step wherein the silicon in the groove area is oxidized. The grooves may then be filled by means of further thermal oxidation, deposition of polycrystalline silicon, or vapor deposition of a dielectric material such as silicon dioxide or silicon nitride.

The J. A. Bondur, et al, U.S. Pat. No. 4,104,086, dated Aug. 1, 1978, and entitled "Method for Forming Isolated Regions of Silicon Utilizing Reactive Ion Etching," and assigned to the same assignee as the present invention, describes an improved method for forming dielectric isolation with filled grooves or depressions of dielectric material. In the preferred embodiment of this invention, it was necessary to reactive ion etch the grooves or depressions through N+ region which was eventually to become the subcollector region for bipolar devices. This presented a difficulty because the N+ region would undercut the portion of the monocrystalline material above the N+ region during certain reactive ion etching conditions. It was thought that this was a very undesirable circumstance. In the manufacture of integrated circuits, wherein a plurality of PNP transistors and NPN transistors are to be formed in the same semiconductor body, there has not been a practical method for fabricating vertical NPN and vertical PNP transistors. Where these structures have been fabricated, there have been compromises in the electrical characteristics of the transistors. These compromises usually lead to low current gain and high saturation resistance for the PNP device. Such a PNP device is inferior in performance compared to the NPN device.

An approach to overcoming the problem of the PNP transistor and NPN transistor formed in the same semiconductor body has been to fabricate a vertical NPN transistor and a lateral PNP transistor simultaneously. In the lateral structure, the N-type epitaxial layer usually comprises the base, with the emitter and collector regions both located in the base but spaced apart. Both emitter and collector regions of the lateral PNP transistor can be formed during the diffusion steps used to form the base region of the double-diffused NPN transistor. Therefore, there are no high temperature processing steps after the formation of the NPN transistor. The lateral PNP transistor formed by this process suffers from two major problems which are that the current gain (beta) of the device fabricated is very low and that the beta falls off rapidly with increase of emitter current. At low emitter-base voltage, injection is mainly into the region between the emitter and collector which is collected by the collector, resulting in high gain. At higher base-emitter voltages, however, the vertical junction between the emitter and the base region turns on resulting in excessive base current and low current gain (beta). J. L. Dunkley, et al, U.S. Pat. No. 3,971,059 illustrates the formation of complementary devices of vertical NPN transistors and lateral PNP transistors.

The A. J. Rideout U.S. Pat. No. 3,656,034, entitled "Integrated Lateral Transistor Having Increased Beta and Bandwidth" is another approach to overcome the problem with current gain in a lateral PNP device.

SUMMARY OF THE PRESENT INVENTION

According to the present invention a method is shown which allows the formation of a lateral PNP or NPN transistor device having improved gain (beta) characteristics. The method involves providing a silicon semiconductor body having an N+ buried region. The body is masked and reactive ion etching of the body is accomplished to form openings in the areas where dielectric isolation is desired to isolate regions of the monocrystalline silicon body. The etch rate of the reactive ion etching is adjusted so as to cause a preferential etching of the heavily doped N+ or P+ region so that a portion of the N+ or P+ region is removed and the monocrystalline silicon remains above this removed portion. The openings are filled with a dielectric material wherein a portion of the monocrystalline silicon region has a dielectric material thereunder. The P type emitter and collector region are simultaneously formed. The emitter region is formed in the portion of the monocrystalline region having dielectric isolation thereunder so that there is no vertical junction between the P type or N type emitter and the buried N+ or P+ region. The electrical contacts are formed to the emitter-base and collector region to form the PNP or NPN lateral transistor. Simultaneously, with the formation of the lateral PNP transistor, a NPN transistor may be formed or alternatively a lateral NPN with a vertical PNP transistor.

A lateral PNP or NPN transistor structure having a monocrystalline silicon region isolated from other such monocrystalline regions by dielectric isolation is formed by the process in the preceding paragraph. The dielectric isolation partially extends into the silicon region below the surface of the silicon region. The emitter region is located above this partially extending isolation in the silicon region. P or N collector and N or P base regions are also within the silicon regions. Electrical contacts are made to the emitter, base and collector regions to form the PNP or NPN lateral transistor structure.

DISCLOSURE OF THE INVENTION

Figure 1:
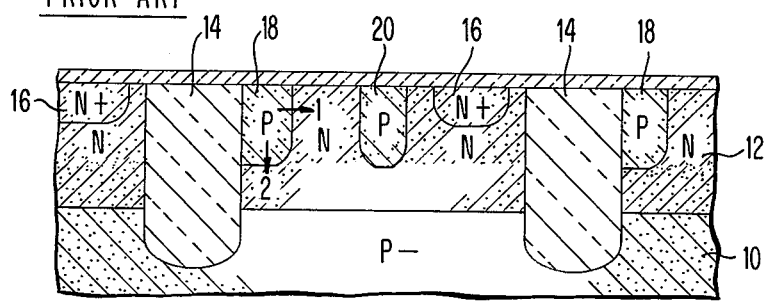
FIG. 1 shows a prior art lateral PNP structure.

Referring now to FIG. 1, the prior art lateral PNP structure is shown. The structure includes the monocrystalline silicon substrate 10 which is shown as a P−, conductivity, a N epitaxial layer 12 formed thereover and isolation region 14 which completely surround pockets of monocrystalline silicon. The isolation region 14 is shown as a dielectric material in FIG. 1. The epitaxial region 12 is the base region for the structure with a N+ diffusion 16 as the base contact therefor. The emitter region 18 and collector region 20 may be simultaneously formed. At a low emitter-base voltage, current injection is mainly into region 1 as indicated by the arrow. This current is collected by the collector region 20 resulting in a high gain (beta). At higher emitter-base voltages, the vertical junction turns on at region 2 resulting in excessive base current and low gain (beta).

Referring now particularly to FIGS. 2-5, the manufacturing steps for the dielectric isolation of one form of the invention are shown. The structure of FIG. 2 includes the monocrystalline silicon substrate 30 which is shown as P− conductivity for illustration purposes, an N+ layer 32 over the substrate 30 and an N conductivity layer 34 on the layer 32. It is preferred to have the layer 32 to be in a high conductivity region where it will ultimately be the collector of an NPN bipolar transistor and provide the means for reactive ion etch undercutting of the monocrystalline region thereabove. This structure can be fabricated by various techniques. However, the preferred technique is to provide a P− monocrystalline silicon substrate and to diffuse an N+ blanket diffusion into the substrate by using conventional diffusion or ion implantation of an N type impurity such as arsenic, antimony or phosphorus to produce an N+ region with a surface concentration of between about $1 \times 10^{19}$ or $1 \times 10^{21}$ atoms/cc. The layer 34 is subsequently grown onto the 30, 32 structure by means of epitaxial growth. This may be done by conventional techniques such as the use of $SiCl_4/H_2$ or $SiH_4/H_2$ mixtures at growth temperatures of about 1000° C. to 1200° C. The N+ layer may have a typical thickness of between about 1-3 microns whereas the epitaxial layer has a thickness of from 0.5 to 10 microns, the exact thicknesses depending upon the device to be built.

Alternatively, the structure could be made by various combinations of thermal diffusion, ion implantation and/or epitaxial growth which would include the formation of a buried subcollector region where subsequent formation of bipolar devices is desired.

Figure 2:
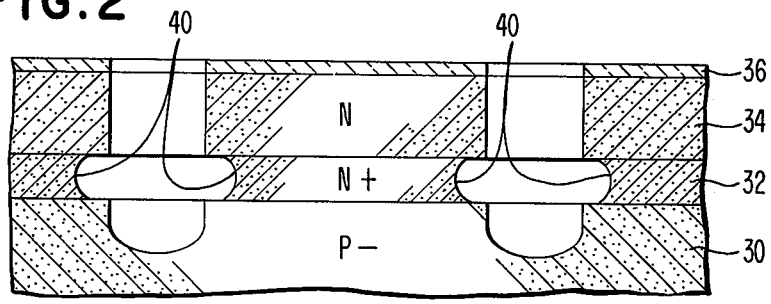
FIG. 2 through FIG. 5 illustrate the process of forming the lateral PNP transistor of the present invention.

The next series of steps, understood with the aid of FIG. 2, are directed to the technique for reactive ion etching of openings or channels in the silicon structure. A silicon dioxide layer 36 is formed by the conventional techniques of either thermal growth at temperatures of between 900° C. to 1000° C. in a wet or dry oxygen ambient or by chemical vapor deposition. Other mask materials can also be used such as silicon nitride and aluminum oxide or combinations thereof and so forth. Openings are formed in the oxide in the regions where dielectric isolation is desired. These openings are formed by the conventional photolithography and etching techniques.

The structure having openings in the layer 36 is now ready for the reactive ion etching process. The process may be more fully understood by reference to the J. M. Havilchuck, et al patent application, Ser. No. 594,413 filed July 9, 1975 for "Reactive Ion Etching of Silicon" now abandoned and continuation patent application Ser. No. 822,775 filed Aug. 8, 1977. The RF induced plasma is reactive chlorine, bromine or iodine specie as specified in the Harvilchuck patent application. The thickness of the masking layer 36 is between about 2,000 to 20,000 Angstroms, the exact thickness depending on the depth requirement of the silicon groove. The precise description of the RF glow discharge apparatus is given in the beforementioned patent application. The reactive ion etch or plasma ambient is preferably a combination of an inert gas such as argon and a chlorine specie. Application of suitable power in the order of about 0.1 to 0.75 watts/$cm^2$ from an RF voltage source will produce sufficient power density to cause the reactive ion etching operation of silicon to be carried out at a rate of about 0.02 to 0.08 micrometers per minute. The desired result of the etching is shown in FIG. 2 wherein the openings or channels at least partially penetrate through the P− conductivity region 30, and some of the removed N+ region 38 partially undercuts region 34 at areas 40. The channels or openings preferably go substantially through the N+ region 32.

The Bondur, et al patent application referred to above describes a process for making openings or channels that are tapered at greater than about 2° from the vertical. This is because the subsequent dielectric filling deposition process results in a slightly thicker deposition near the top of the groove as opposed to the bottom of the groove. Thus, in case of vertical grooves, there is at one stage, an overgrowth of the remaining narrow groove which results in poor dielectric material quality in the region below the overgrown area. In case of a sufficiently tapered groove, the groove is filled up from the bottom.

The change in etch rates, power used, reactive specie chosen and the amount of the specie in the ambient influences the underetching of highly doped N+ and P+ regions such as region 32. At etch rates of about 0.07 micrometers per minute, vertical grooves with no lateral N+ undercut etching are formed, as indicated in the Bondur, et al patent application.

However, at etch rates higher than 0.07 micrometers per minute and as high as 0.20 micrometers per minute significant underetching of the N+ region can occur, provided the power density of RIE tool is in the range of 0.1-0.5 watts/$cm^2$ and the total gas pressure is about 10-40 microns of mercury. The cathode is water cooled and no special thermal wafer contacting method to that cathode is used. Alternatively, underetching can also be favored by thermally heating the substrate to 100°-200° C. Under those circumstances, the necessary etch rates can be less than 0.07 micrometers per minute. It has also been found that a P+ region substituted for N+ is undercut under virtually the same conditions indicated above for N+ undercutting.

Figure 3:
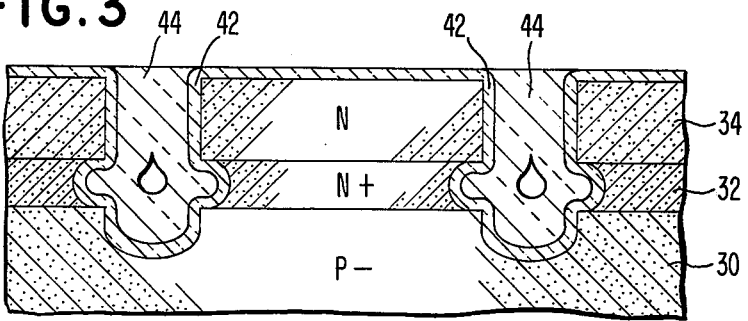

Referring now to FIG. 3, the next step in the process is to thermally oxidize the openings or channels by subjecting the body to an oxidation ambient which may be for example 970° C. in wet oxygen. The body is subjected to the ambient for about 10 to 30 minutes to produce the preferred silicon dioxide thickness within the opening or channel of about 500 to 2000 Angstroms. The purpose of the thermal oxide 42 is to assure good silicon/silicon dioxide interface properties, the qualities of which are usually not as good with chemical vapor deposited dielectric material. Good quality dielectric material is necessary to permit the subsequent abutting of diffused junctions against the dielectric isolation.

The minimum thickness is nominally 500 Angstroms so that a good thermal silicon dioxide layer is formed. Any thinner layer could present difficulties because of pin holes in the oxide and therefore cause electrical integrity problems.

The maximum thickness is primarily dictated by the time required at elevated temperatures. Long times at high temperatures will tend to move any diffused junction within the silicon regions. Very thick oxide films formed at such temperatures will also cause stress problems in the silicon material.

The grown oxide 42 will follow almost precisely the geometry of the sidewalls in the opening formed by the reactive ion etching step. The next step, involving the filling of the opening with a suitable dielectric material, is shown completed in FIG. 3 wherein the opening or channel is filled with vapor deposited silicon dioxide layer 44. This filling by vapor deposited silicon dioxide layer 44 will in general follow the contour of the channel so that the channel or opening will be completely closed at the top, while in the center region of the channel at the depth of the N+ underetched region a void will occur, as indicated in FIG. 3. The vapor deposition will also completely cover the surface of the silicon body. The preferred filling process is a chemical vapor deposition of silicon dioxide using gas mixtures of $SiH_4$/$CO_2$/$H_2$, $SiH_4$/$N_2O$/$N_2$ or $SiCl_2H_2$/$N_2O$ in the temperature range of 800°-100° C.

Further details of the process of filling and providing a uniform surface as shown in FIG. 3 can be found in the Bondur, et al patent application referred to above.

Figure 4:
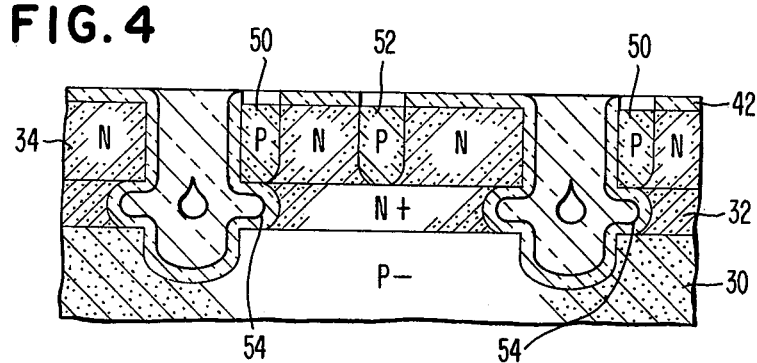
Figure 5:
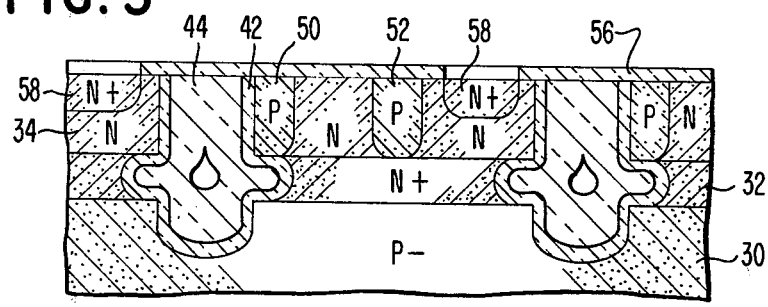

Referring now to FIG. 4, conventional photolithography steps are made to provide a photoresist mask (not shown) on the surface of silicon dioxide surface coating 42 which will form openings at the position of regions where emitter and collector diffusions 50 and 52, respectively, are to be formed. The regions 50 and 52 may be formed by diffusion or ion implantation techniques. In the ion implantation alternative, it is preferred to use boron as the implant material and its dosage is $1 \times 10^{14}$ atoms/cm$^2$ and the power required is 80 KeV. The resulting structure is shown in FIG. 4, wherein the P emitter regions 50 are located in the monocrystalline silicon region above dielectric material 54 which completely does away with the vertical PN junction of the prior art as shown in FIG. 1. The surface is reoxidized and openings are made using conventional photolithography steps to form openings in the silicon layer 56 where the base contact regions are to be formed as shown in FIG. 5. The structure is placed in a suitable diffusion or ion implantation apparatus to form the base contact region 58. In the case of ion implantation, the preferred implant material is arsenic and its dosage is $3 \times 10^{15}$ atoms/cm$^2$ and the power requred is 40 KeV. The resulting structure is shown in FIG. 5. The surface of the body is reoxidized, and electrical contacts are made to the lateral PNP elements.

Figure 6:
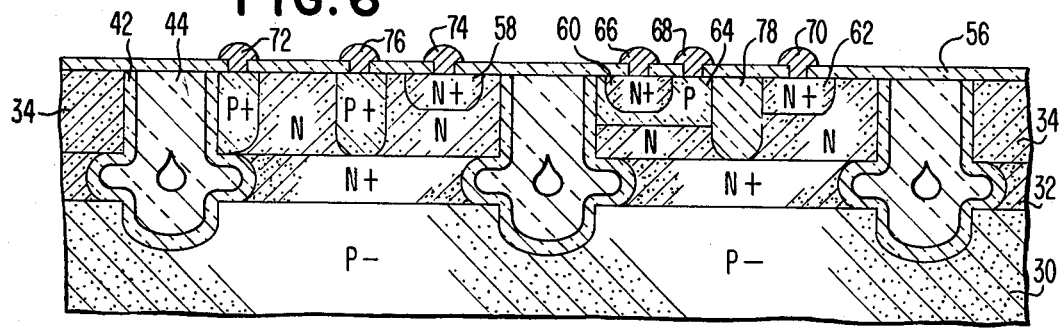
FIG. 6 illustrates a vertical NPN and lateral PNP transistor structures formed by the method of the present invention.

FIG. 6 shows a completed semiconductor device with electrical contacts having both a lateral PNP transistor and a vertical NPN transistor in the same integrated circuit and in adjacent monocrystalline regions.

In making the FIG. 6 device, it is possible to use the base contact diffusion or ion implantation to form the emitter region 60 and the collector contact 62 for the vertical NPN transistor which includes emitter region 60, base region 64, and collector contact region 62. To make electrical contacts to the regions in the monocrystalline, a suitable ohmic contact metal is evaporated or deposited by other means onto the upper surface of the structure after openings have been formed to the appropriate regions. A typical contact material is aluminum or aluminum-copper. However, other well known materials in the art can be used, such as platinum, titanium-tungsten, etc. Photolithography and etching techniques are utilized to form the desired conductive lines on the surface of the semiconductor structure. The resulting FIG. 6 structure has metal electrodes 66 to the emitter of the vertical transistor 68 to the base 70 to the collector. The lateral PNP transistor has metal contacts 72 to the emitter, 74 to the base, and 76 to the collector of the transistor. There is shown a dielectric isolation region 78 between the collector reach through region 62 and the base region 64 of the vertical NPN transistor. This region 78 can be made by similar techniques to that described in making the dielectric isolation regions 44.

While the invention has been illustrated and described by reference to the preferred embodiments of our invention, it is to be understood that we do not limit ourselves to the precise constructions herein disclosed and the right is reserved to all changes and modifications coming within the scope of the invention as defined in the appended claims.

We claim:

1. A lateral PNP transistor structure comprising:
   a monocrystalline silicon region isolated from other such regions by dielectric isolation;
   the said dielectric isolation partially extending into said silicon region below the surface of said silicon region;
   a P emitter region located above said partially extending isolation in said silicon region;
   P collector region and N base region within said silicon region; and
   electrical contacts to said emitter base and collector regions forming said PNP lateral transistor structure.

2. The lateral PNP transistor structure of claim 1 wherein the extension of said dielectric isolation under said monocrystalline silicon region is between about 1 to 3 microns.

3. The lateral PNP transistor structure of claim 1 wherein the dimensions of the emitter region are between about 1 by 1-3 by 3 microns squared.

4. The lateral PNP transistor structure of claim 1 wherein the dielectric material is silicon dioxide.

5. A lateral NPN transistor structure comprising:
   a monocrystalline silicon region isolated from other such regions by dielectric isolation;
   the said dielectric isolation partially extending into said silicon region below the surface of said silicon region;
   an N emitter region located above said partially extending isolation in said silicon region;
   N collector region and P base region within said silicon region; and
   electrical contacts to said emitter base and collector regions forming said NPN lateral transistor structure.

6. An integrated circuit comprising:

a silicon semiconductor body composed of a substrate, an N type epitaxial layer and an N+ type layer at the interface between said substrate and said epitaxial layer, having regions of monocrystalline silicon isolated from one another by dielectric isolation;

the said dielectric isolation partially extending into said regions of monocrystalline silicon below the surface of said silicon region;

a PNP lateral transistor in at least one of said regions of monocrystalline silicon having its P emitter located over said partially extending dielectric isolation;

an NPN vertical transistor located in at least another of said regions of monocrystalline silicon; and electrical contacts to the emitter, base and collector contacts for said PNP and NPN transistors.

7. The integrated circuit of claim 6 wherein the said dielectric isolation partially extends into said N+ type layer.

8. The integrated circuit of claims 6 or 7 wherein the extension of said dielectric isolation under said regions of monocrystalline silicon is between about 1 to 3 microns.

9. The integrated circuit of claim 8 wherein the dimensions of said PNP lateral transistor emitter is 1 by 1 to 3 by 3 microns squared.

10. An integrated circuit comprising:
a silicon semiconductor body composed of a substrate, a P type epitaxial layer and a P+ type layer at the interface between said substrate and said epitaxial layer, having regions of monocrystalline silicon isolated from one another by dielectric isolation;

the said dielectric isolation partially extending into said regions of monocrystalline silicon below the surface of said silicon region;

a NPN lateral transistor in at least one of said regions of monocrystalline silicon having its N emitter located over said partially extending dielectric isolation;

a PNP vertical transistor located in at least another of said regions of monocrystalline silicon; and electrical contacts to the emitter, base and collector contacts for said NPN and PNP transistors.

* * * * *